United States Patent [19]

Lanz et al.

[11] 4,063,164

[45] Dec. 13, 1977

[54] METHOD AND APPARATUS FOR DETECTION OF SHORT CIRCUITS BY PHASE MONITORING TRAVELING WAVE SIGNALS

[75] Inventors: Otto Lanz; Jiri Mastner, both of Niederrohrdorf; Michael Vitins, Zurich, all of Switzerland

[73] Assignee: BBC Brown Boveri & Company Limited, Baden, Switzerland

[21] Appl. No.: 696,140

[22] Filed: June 14, 1976

[30] Foreign Application Priority Data

June 19, 1976 Switzerland .......................... 7979/76

[51] Int. Cl.² ........................................... G01R 31/08
[52] U.S. Cl. .................................................... 324/52
[58] Field of Search ................. 324/51, 52; 317/36 D; 179/175.3 F

[56] References Cited

U.S. PATENT DOCUMENTS

| | | | |
|---|---|---|---|
| 2,953,722 | 9/1960 | Willis | 317/36 D |
| 3,048,744 | 8/1962 | Warrington | 317/36 D X |
| 3,378,728 | 4/1968 | Humpage et al. | 317/36 D |
| 3,379,934 | 4/1968 | Hoel et al. | 317/36 D |
| 3,590,368 | 6/1971 | Esclangon | 324/51 |
| 3,651,377 | 3/1972 | Souillard | 317/36 D X |
| 3,800,215 | 3/1974 | Souillard | 324/52 |
| 3,898,530 | 8/1975 | Perez-Cavero | 317/36 D X |

*Primary Examiner*—Gerard R. Strecker
*Attorney, Agent, or Firm*—Werner W. Kleeman

[57] ABSTRACT

A method of and apparatus for the detection of short-circuits on lines operated with voltages and currents containing an alternating component, by detecting the temporal progression of the voltage and current at a measurement location in the form of measurement voltages and measurement currents. From the measurement voltage and measurement current or from magnitudes derived therefrom there are formed traveling wave signals of the form:

$$a(t) = k \cdot (u_m + R_w i_m) \text{ and}$$

$$b(t) = k \cdot (-u_m + R_w i_m)$$

wherein $u_m$ represents the measurement voltage and $i_m$ the measurement current or magnitudes derived therefrom, $R_w$ an impedance factor and $k$ a freely introducible proportionality factor. There is monitored the mutual phase position of at least one respective frequency component of the oppositely moving traveling wave signals as a magnitude characterizing the condition of the line.

13 Claims, 4 Drawing Figures

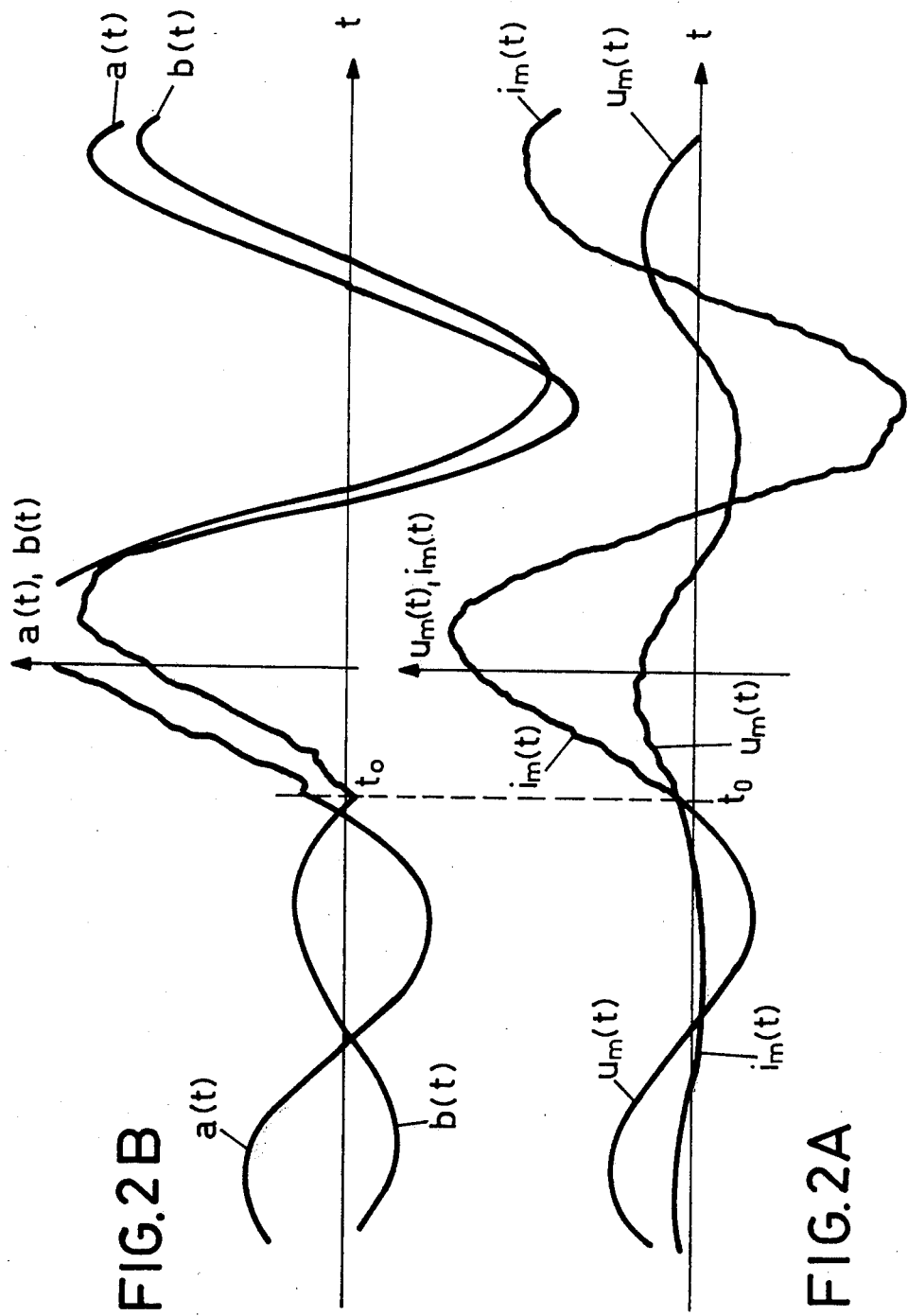

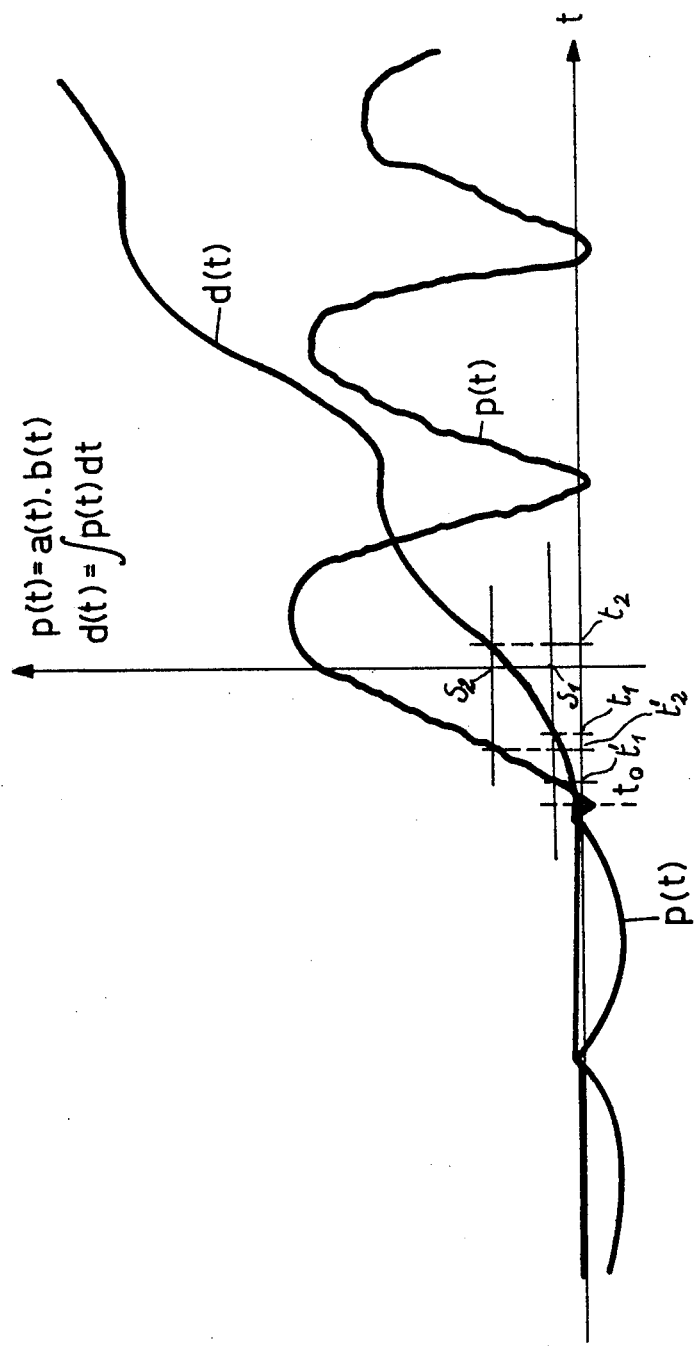

METHOD AND APPARATUS FOR DETECTION OF SHORT CIRCUITS BY PHASE MONITORING TRAVELING WAVE SIGNALS

BACKGROUND OF THE INVENTION

The present invention relates to a new and improved method for the detection of short-circuits on lines operated with voltages and currents containing an alternating component, by determining the course as a function of time of the voltage and current at a measurement location in the form of measurement voltages and measurement currents. Further, the invention relates to apparatus for the performance of such method.

The detection of short-circuits on lines is a prerequisite for carrying out subsequent protective measures and therefore as the stimulus for a fault location or fault location-localization at a sufficiently limited line section plays a major role in the design of a line- or network protective system. In consideration of the extremely different possibilities of fault location or fault location-localization and furthermore the identification of the type of fault (selection) following the fault detection the latter constitutes an independent technical problem which generally also can be solved with its own circuit devices.

Normally fault detection takes place for instance with the aid of a minimum-impedance method and appropriate relay, as for instance has been disclosed in the publication "Brown Boveri Mitteilungen", Volume 53, No. 11/12, pg. 788. Such type methods are predicated upon a comparison of current and voltage, in other words respond to the current increase characteristic of a short-circuit accompanied by a rather pronounced dropping of the line voltage at the measurement location. The method which has been indicated to be known to the art functions with rectification of signals associated with the measurement voltage and measurement current and with a difference formation of the rectified signals. The null cross-overs of the difference signal determine the integration interval of a subsequent integration with constant ascending speeds. The momentarily obtained amplitude of the time integral is therefore a function of the relationship between the measurement voltage and measurement current, so that the relationship prevailing in the case of a short-circuit can be associated with a predetermined boundary value of the time integral, and upon falling below or exceeding this boundary value there can be determined the normal state or fault state, respectively, of the line.

With the comparatively rapid excitation method and excitation apparatuses of the type known, to which there also belongs the above-mentioned example, there can be realized detection times, which desirably should be further reduced in the interest of more rapidly undertaking protective measures.

SUMMARY OF THE INVENTION

It is an important object of the present invention to provide a fault detection method and apparatus with which there can be realized such reduction of the detection time.

In keeping with the aforementioned objective the invention proposes a method for the detection of short-circuits on lines operated with voltages and currents containing an alternating component, by detecting the temporal progression i.e. the course as a function of time of the voltage and current at a measurement location in the form of measurement voltages and measurement currents. According to the teachings of the invention there are formed from the measurement voltage and the measurement current or magnitudes derived therefrom traveling wave signals of the form $$a(t) = k \cdot (u_m + R_w \cdot i_m) \text{ and}$$

$$b(t) = k \cdot (-u_m + R_w \cdot i_m)$$

wherein $u_m$ denotes a measurement voltage and $i_m$ a measurement current or magnitudes derived therefrom, $R_w$ an impedance factor and $k$ a freely determinable proportionality factor, and the mutual phase position of at least one respective frequency component of the oppositely moving traveling wave signals are monitored as a magnitude characterizing the condition or state of the line.

The apparatus for the performance of the aforesaid method, as contemplated by the invention, comprises a measurement voltage channel connected to a voltage measurement device and a measurement current channel containing a constant factor multiplier connected to a current measuring device, the measurement voltage channel and the measurement current channel are connected in parallel to an addition circuit and a subtraction circuit and the outputs of both of these circuits are connected with a phase angle detector.

Accordingly the present detection method is predicated upon the formation and evaluation of oppositely moving traveling wave signals i.e., signals formed at the measurement or measuring location, the temporal progression or course as a function of time of which corresponds to that of oppositely moving traveling waves on the line, considered at the measurement location. The impedance factor $R_w$ determining the relationship of the measurement voltage-dependent signal components to the measurement current-dependent signal components can be adjusted within comparatively wide limits, wherein, however, in the interest of the detection reliability of short-circuits minimumly appearing at the measurement location, i.e. short-circuits with the maximum possible arc- or fault impedance at a maximum distance from the measurement location, there is to be generally observed a certain minimum value of this impedance factor.

When this impedance factor approaches a value corresponding to the wave or characteristic impedance of the line there especially result traveling wave signals which correspond to oppositely moving traveling waves of an amplitude decreasing only by virtue of damping, however otherwise possessing a constant profile or outline contour along the line and a defined propagation velocity. For certain additional fault determination operations, such as for instance, distance- or direction determinations, such type special traveling wave signals or signals approximating such can be advantageous. For the purpose of the present fault detection and especially with low content of the measurement signal in transient spectral components there are permissible, apart from the generally dominant network frequency components, comparatively large deviations of the impedance factor from the wave impedance of the line.

Furthermore, with the present method the formed traveling wave signals are monitored with respect to the mutual phase position of at least one of their spectral components, preferably the network frequency component. This relative phase position, when there occurs a short-circuit on the line experiences a jump-like change. During the normal operation of conventional alternating-current lines for power transmission the dominant network frequency components of the oppositely moving traveling wave signals are essentially opposite in phase to one another, whereas in the presence of a short-circuit approximately in-phase. There is therefore afforded the possibility of a continuous monitoring of the mutual phase position of the network frequency components or also other suitable frequency components of the traveling wave signals, and as the detection criterion there can be employed exceeding of a phase change of a predetermined minimum value corresponding to the disturbance peak which is to be taken into account. In relation to the conventional methods with amplitude comparison, which generally is only possible once within a half-cycle, there is realized with the continuous phase monitoring a considerably reduced detection time which is not bound to the cycle duration of the observed frequency component. This advantage is also present for the case that the phase monitoring is associated with an integration and boundary value monitoring of the time integral, because then again there is decisive a non-delayed integration start owing to the continuous phase monitoring and an integration time which is independent of the cycle duration.

BRIEF DESCRIPTION OF THE DRAWINGS

The invention will be better understood and objects other than those set forth above, will become apparent when consideration is given to the following detailed description thereof. Such description makes reference to the annexed drawings wherein:

FIG. 2A is a time diagram of the measurement voltage $u_m$ and the measurement current $i_m$ over the time that there occurs a short-circuit;

FIG. 2B illustrates the time course of the associated traveling wave signals $a(t)$, $b(t)$; and FIG. 3 illustrates the time course of a product signal $p(t)$ formed from both traveling wave signals as well as a detection signal $d(t)$ obtained therefrom by half-wave rectification and integration.

DETAILED DESCRIPTION OF THE INVENTION

Figure 1:
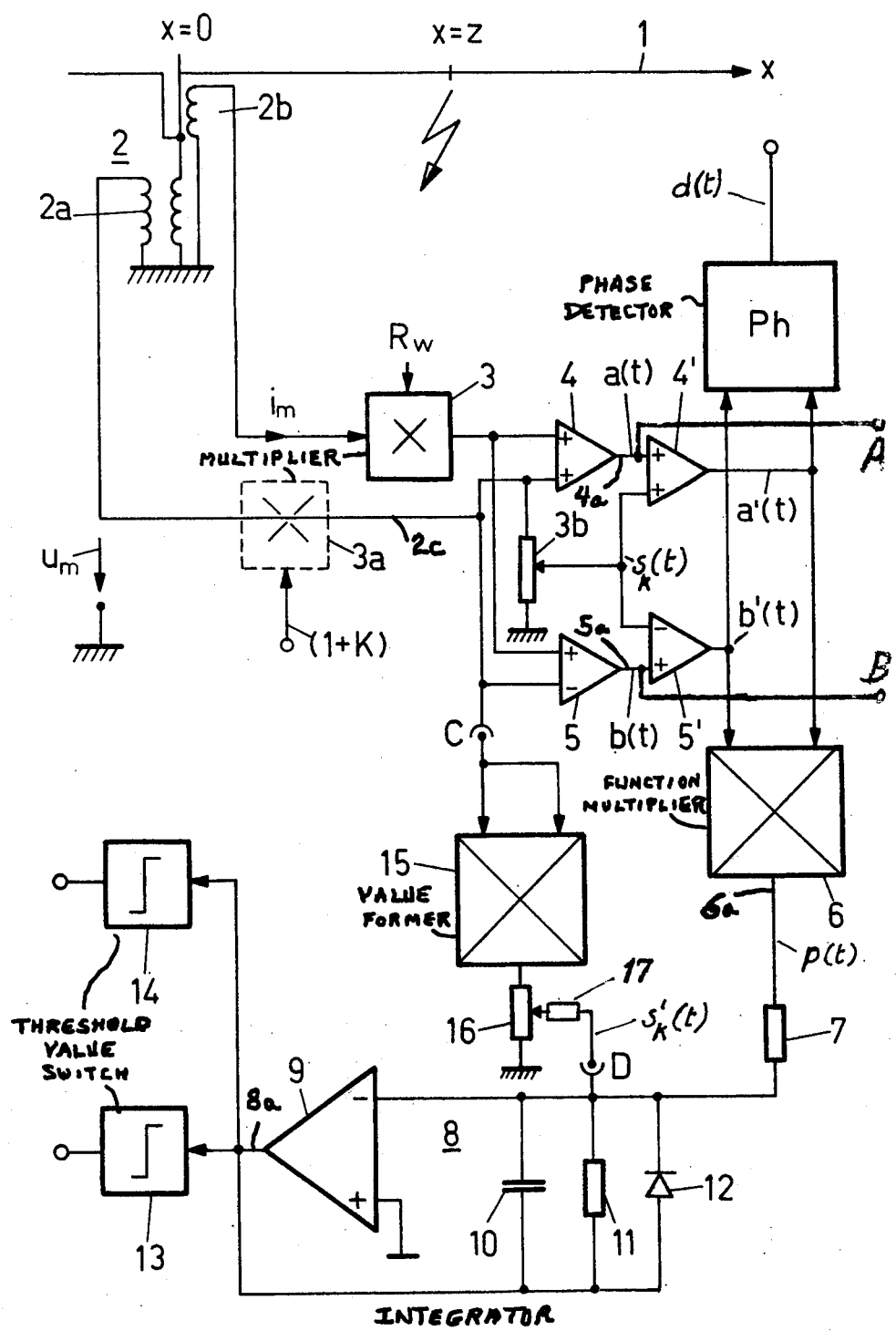
FIG. 1 illustrates a principal block circuit diagram of a fault detection circuit according to the invention.

Describing now the drawings, in the showing of FIG. 1 there is illustrated a line consisting of, for instance, an above-ground conductor 1 and extending in the direction $x$ and having a measurement or measuring station 2 at a measurement location $x = o$. It is assumed there exists a short-circuit at the fault location $x = z$. The measurement station 2 comprises a voltage converter 2a having as its output signal the measurement voltage $u_m$ and a current converter 2b having as its output signal a measurement current $i_m$. The measurement voltage $u_m$ and measurement current $i_m$ can be present, for instance, in the form of signals having the dimension of a voltage. The measurement current $i_m$ is multiplied in a constant factor multiplier 3 by an impedance factor $R_w$, the magnitude of which corresponds at least to that of the maximum occurring line input impedance (maximum arc resistance + maximum line impedance) in the case of a fault, and then is delivered together with the measurement voltage $u_m$ in parallel to a first addition or summation amplifier 4 and a first subtraction amplifier 5. At the outputs 4a and 5a of these amplifiers 4 and 5 respectively, there thus appear two oppositely moving traveling wave signals (both can still be multiplied with a freely selectable scale factor):

$$a(t) = u_m + R_w \cdot i_m$$

$$b(t) = -u_m + R_w \cdot i_m$$

i.e. signals having a temporal progression i.e. a course as a function of time which is associated with oppositely moving traveling wave signals on the line and occurring at the measurement location $x = 0$. It is to be pointed out that in the sense of the present invention this correlation can be justified for different modifications of the original measurement signals, i.e. measurement voltage and measurement current, in particular filtering which is advantageous in the case of pronounced content of upper harmonics in order to accentuate a frequency component or also for limiting or a similar transformation of the measurement signal, by means of which the phase relationship of the oppositely moving traveling wave signals is not appreciably disturbed.

In the exemplary embodiment there is made the assumption, which approximates practice, that the traveling wave signals not only contain a dominant frequency component corresponding to the network frequency prior to the short-circuit but also thereafter, so that there is not necessary any special input filtering.

The oppositely moving traveling wave signals after passing in each case through a second addition or summation amplifier 4' and a subtraction amplifier 5' —such serve for correction purposes as will be explained hereinafter— in the form of corrected traveling wave signals $a'(t)$ and $b'(t)$ are delivered to for instance a conventional phase detector Ph, at the output of which there is available a detection signal $d(t)$ which is already basically suitable for short-circuit monitoring. The traveling wave signals additionally appear at the outputs A, B for other fault protection purposes, for instance for a fault direction- or fault distance determination.

Further, in FIG. 1 there is illustrated a special phase monitoring circuit —likewise following the not particularly referenced outputs of the components 4', 5'. The traveling wave signals are delivered to a function multiplier 6, the output 6a of which delivers an appropriate product signal $p(t)$ to an integrator 8 provided with the amplifier 9 and feedback capacitor 10. The product signal $p(t)$ can be already basically employed as a measure for the mutual phase position of both traveling wave signals and thus basically as the detection signal. The subsequent integration brings about a suppression of disturbing upper harmonics and thus renders possible a comparatively sensitive boundary value monitoring by means of a threshold value switch 13 set to a corresponding low boundary value. Additionally there is connected to the output 8a of the integrator 8 a second threshold value switch 14 set to a higher boundary value, which for a given ascent or rise speed of the time integral exhibits a greater response delay. The output of the second threshold value switch 14 accordingly can be used for rechecking the first more sensitive fault detection of lesser delay.

The network frequency components of the oppositely moving traveling wave signals are essentially opposite in phase within the region of the normal operating state, provided that the value of the line input impedance does not fall below that of the impedance factor $R_w$, but on the other hand after the occurrence of a short-circuit essentially in-phase. The product signal $p(t)$ in the first case is then negative and in the second case positive. Due to the generally small phase difference between the line voltage and line current in the normal operating state the product signal $p(t)$ briefly becomes negative. In order to obtain a defined signal level in the normal operating state it is possible according to the showing of FIG. 1 to provide a diode 12 at the input of the integrator 8 which essentially functions as a half-wave or single-wave rectifier and completely or partially suppresses the negative values of the product signal i.e. limits such to a low value. Such type polarized suppression element basically also can be arranged at the output of the integrator or —as illustrated in the example— parallel to the feedback branch of the integrator.

A discharge resistor 11 serves to reset the integrator 8 into a neutral starting condition after disappearance of a fault-indicating product signal. If necessary, there can be employed instead of such also a discharge-switching device which in obvious manner should be activated after there has occurred fault detection.

In the case of line input impedances possibly arising during the fault-free operation and whose value is below that of the impedance factor $R_w$, the product $p(t)$ becomes slightly positive already without the occurrence of a fault. This preferably is so for comparatively large adjusted impedance factors $R_w$, for instance within the range of the wave or characteristic impedance of the line. In order to correct the signal relationship for extreme load conditions during fault-free operation in the sense of simulating a fault there exist different possibilities which have been indicated in FIG. 1.

For this purpose there can be tapped-off at a constant factor multiplier in the form of a potentiometer 3b coupled with the measurement voltage channel 2c a correction signal $s_k(t)$ and additively superimposed via the already mentioned amplifiers 4' and 5' respectively, with the polarity of the original traveling wave signals determined by the sign of the illustrated amplifier inputs. Thus there are formed the corrected traveling wave signals which can be expressed by the following:

$$a'(t) = u_m(1+K) + R_w i_m$$

$$b'(t) = -u_m(1+K) + R_w i_m$$

In this respect the correction factor K at the potentiometer 3b is to be adjusted in the fault-free condition according to the relationship:

$$K = \frac{R_w - R_{min}}{R_{min}}$$

wherein $R_w$ is the impedance factor and $R_{min}$ a predetermined minimum value of the line input impedance. There is then valid for the corrected product signal:

$$p(t) = -u_m^2(1+K)^2 + R_w^2 \cdot i_m^2$$

The square term of $u_m$ is accordingly increased such that for the entire contemplated load range there exist suitable sign conditions.

This correction, if desired, also can be carried out at the voltage measurement channel 2c in front of the summation- and subtraction elements for the traveling wave signal formation, for instance with the constant factor multiplier 3a indicated in phantom lines of FIG. 1, which however must function as an amplifier with a gain (1+K).

Another alternative is indicated in FIG. 1 for the circuit branch between the points C and D, and specifically constituting a value former to which there is delivered the measurement voltage. In this case the value former is a squaring amplifier 15 equipped with a subsequently arranged constant factor multiplier in the form of a potentiometer 16. There is produced in this instance a correction signal.

$$s_{k'}(t) = -K' \cdot u_m^2$$

with the correction factor $$K' = \frac{R_w^2}{R_{min}^2} - 1.$$

This correction signal is additively superimposed upon the product signal by means of the summation resistors 7 and 17 and with the indicated adjustment of the correction factor likewise results in the intended unambiguousness of the sign relationship. The last-described embodiment indeed requires a multiplier instead of simple summation or adding elements, however does not affect the original traveling wave signals, for instance for another fault direction- or fault distance determination.

For the mode of operation shown in the graphs of FIGS. 2A, 2B and 3 there is valid the following:

At the point in time $t_o$ the measurement current $i_m$ exhibits a pronounced ascent exceeding its preceding course, whereas the measurement voltage $u_m$ experiences much less of a change and essentially only become more pronounced in its content of uppr harmonics. Such a voltage- and current course corresponds to practical conditions for line short-circuits which are not too close to the measurement location. Both before as well as after the short-circuit there in any case appears in the current and voltage the network frequency components in an extensively dominating manner, so that for instance no special input filtering is required.

In FIG. 2B there is shown the course of the oppositely moving traveling wave signals $a(t)$ and $b(t)$ both before and after the short-circuit. The abrupt transition between approximately opposite phase and approximately inphase of such signals at the point in time $t_o$, i.e. upon the occurrence of the fault-characterizing traveling waves at the measurement location, likewise corresponds to conditions which have been measured in practice. The comparatively slight deviation of exact opposite phase of the oppositely moving traveling wave signals for the time course of the product signal $p(t)$ shown in FIG. 3 prior to occurrence of a short-circuit results in a brief periodic shifting into the positive region with otherwise completely dominating course in the negative region. This phenomenon is compensated by the previously described correction measures, which are not here illustrated. Conversely, after a short-circuit the product signal has a predominantly positive course with only brief periodic shifting into the negative region, which moreover no longer can be effective for the fault detection. The integral detection signal $d(t)$, likewise illustrated in FIG. 3, remains practically at zero during the interval with negative product signal prior to short-circuit occurrence owing to the suppression circuit explained during the discussion of FIG. 1, and the brief positive portions of the integrand signals, also without the need for any special correction, after a brief period of time become ineffective at the output of the integrator due to the decaying time behavior by virtue of the discharge resistor 11.

Starting with $t_o$ the integral detection signal $d(t)$ ascends essentially monotone, so that upon exceeding a first boundary value $S_1$ at the time $t_1$ triggering of the first threshold value switch 13 takes place and upon exceeding a second boundary $S_2$ at the time $t_2$ triggering of the second threshold value switch 14 occurs.

It will be apparent that the time delay between $t_o$ and the relevant triggering operation is not basically limited, rather only by the integration time-constant of the integrator, i.e. essentially by the intended filtering effect in consideration of higher frequency-disturbance signals. Furthermore, it will be clear that basically there is also possible a detection with both of the boundary values directly by the product signal at the time points $t'_1$ and $t'_2$ with still less delay, essentially only limited by the time course of the signals. The course of the triggering operations obviously can be influenced by the adjustment of the triggering-boundary values and also in this regard is essentially dependent only upon the disturbance signal conditions.

While there are shown and described present preferred embodiments of the invention, it is to be distinctly understood that the invention is not limited thereto, but may be otherwise variously embodied and practiced within the scope of the following claims. ACCORDINGLY,

What we claimed is:

1. A method for the detection of short-circuits on lines, which are operated with voltages and currents containing an alternating component, by detecting the course as a function of time of the voltage and current at a measurement location in the form of measurement voltages and measurement currents, the improvement comprising the steps of: forming from the measurement voltage and measurement current or magnitudes derived therefrom oppositely moving traveling wave signals of the form $$a(t) = k \cdot (u_m + R_w \cdot i_m) \text{ and}$$

$$b(t) = k \cdot (-u_m + R_w \cdot i_m)$$

wherein $u_m$ designates a measurement voltage and $i_m$ a measurement current or magnitudes derived therefrom, $R_w$ an impedance factor and $k$ a freely introducable proportionality factor, and monitoring the mutual phase position of at least one respective frequency component of the oppositely moving traveling wave signals ($a(t)$, $b(t)$) as a magnitude characterizing the condition of the line.

2. The method according to claim 1, including the steps of selectively adding at least any one of the measurement voltage or the traveling wave signals to a correction signal proportional to such measurement voltage, the frequency components to be evaluated of both thus obtained corrected traveling wave signals being opposite in phase for a predetermined value of the line input impedance, said value being less than the adjusted impedance factor.

3. The method according to claim 1, including the steps of multiplying by one another two oppositely moving traveling wave signals to obtain a product signal, and utilizing the thus obtained product signal as a monitoring magnitude characterizing the mutual phase position of the oppositely moving traveling wave signals.

4. The method according to claim 3, wherein the correction signal corresponds to a fraction of the measurement voltage and is defined by the ratio of the difference between the impedance factor and the minimum value of the line input impedance with respect to the latter itself.

5. The method according to claim 3, including the step of superimposing upon said product signal a correction signal which is dependent in the same sense upon the value of the measurement voltage.

6. The method according to claim 5, including the step of additively superimposing upon the product signal a correction signal which is proportional to the square of the measurement voltage.

7. The method according to claim 1, including the steps of forming a signal associated in magnitude and sign with at least any one of the magnitude or the direction of the mutual phase position of the oppositely moving traveling wave signals, and carrying out an integration followed by boundary value monitoring.

8. An apparatus for the detection of short-circuits on a line, operated with voltages and currents containing an alternating component, by detecting the course as a function of time of the voltage and current at a measurement location in the form of measurement voltages and measurement currents, said apparatus comprising a voltage measurement device for detecting the measurement voltage, a current measurement device for detecting the measurement current, a measurement voltage channel connected in circuit with the voltage measurement device, a measurement current channel connected in circuit with said current measurement device, said measurement current channel including a constant factor multiplier, an addition circuit having input means and output means, a subtraction circuit having input means and output means, said measurement voltage channel and said measurement current channel being connected in parallel with the respective input means of said addition circuit and said subtraction circuit, a phase angle detector, said output means of both said addition circuit and said subtraction circuit being connected with said phase angle detector.

9. The apparatus according to claim 8, further including a correction-constant voltage multiplier operatively connected with the measurement voltage channel.

10. The apparatus according to claim 8, further including a function multiplier having an input side and an output side, the output means of the addition circuit and said subtraction circuit being connected with the input side of said function multiplier.

11. The apparatus according to claim 10, further including a value function former having an input side and an output side, the input side of said value function former being connected with the measurement voltage channel, a constant factor multiplier connected with the output side of said value function former, said constant factor multiplier having an output, a summation circuit, the output of said constant factor multiplier and the output of the function multiplier being connected with said summation circuit.

12. The apparatus according to claim 10, further including a circuit connected with the function multiplier for at least partially suppressing one polarity of a product signal formed from traveling wave signals.

13. The apparatus according to claim 10, further including integrator means having an input side and an output side, said function multiplier being connected with the input side of said integrator means, and at least one threshold value switch connected with the output side of said integrator means.

* * * * *